United States Patent
Bailey

(10) Patent No.: US 8,231,250 B2
(45) Date of Patent: Jul. 31, 2012

(54) WARM WHITE LIGHTING DEVICE

(75) Inventor: Edward Bailey, Westampton, NJ (US)

(73) Assignee: Lighting Science Group Corporation, Satellite Beach, FL (US)

( * ) Notice: Subject to any disclaimer, the term of this patent is extended or adjusted under 35 U.S.C. 154(b) by 0 days.

(21) Appl. No.: 12/677,363

(22) PCT Filed: Sep. 10, 2008

(86) PCT No.: PCT/US2008/075770
§ 371 (c)(1), (2), (4) Date: Nov. 16, 2010

(87) PCT Pub. No.: WO2009/036001
PCT Pub. Date: Mar. 19, 2009

(65) Prior Publication Data
US 2011/0051394 A1  Mar. 3, 2011

Related U.S. Application Data

(60) Provisional application No. 60/971,255, filed on Sep. 10, 2007.

(51) Int. Cl.
*F21V 5/00* (2006.01)
(52) U.S. Cl. .......... 362/328; 362/244; 362/311.02; 362/327
(58) Field of Classification Search .......... 362/240–248, 362/249.02, 311.02, 327–328, 332–340, 362/800
See application file for complete search history.

(56) References Cited

U.S. PATENT DOCUMENTS

| | | | |
|---|---|---|---|
| 6,980,321 B2 | 12/2005 | Ramanujan et al. | |
| 2004/0239243 A1 | 12/2004 | Roberts et al. | |
| 2005/0174649 A1* | 8/2005 | Okada et al. | 359/619 |
| 2006/0239006 A1 | 10/2006 | Chaves et al. | |

OTHER PUBLICATIONS

PCT International Search Report and Written Opinion for International Application No. PCT/US2008/075770; International filing date: Sep. 10, 2008; Date of Mailing: Nov. 18, 2008; 7 pgs.

* cited by examiner

*Primary Examiner* — Stephen F Husar
*Assistant Examiner* — Meghan Dunwiddie
(74) *Attorney, Agent, or Firm* — Cantor Colburn LLP

(57) ABSTRACT

The present invention relates to warm white light engines including combinations of blue, cyan, and red, red-orange, or amber emitters and one or more phosphors that produce a white light pleasing to the human eye through the use of improved color uniformity and improved collimation of light. Specifically, a micro-lenslet array having an optimized surface is used to disperse light from the light emitter; an inner-collimation lens having an optimized cross-sectional shape and micro-ridges is used to disperse light; a TIR reflector having an optimized cross-sectional shape and micro-ridges is used to disperse and redistribute phase as well as provide collimation; and a final micro-lenslet layer includes optimized lenslet design placement and randomization factor to homogenize light to produce a uniform warm white light.

33 Claims, 14 Drawing Sheets

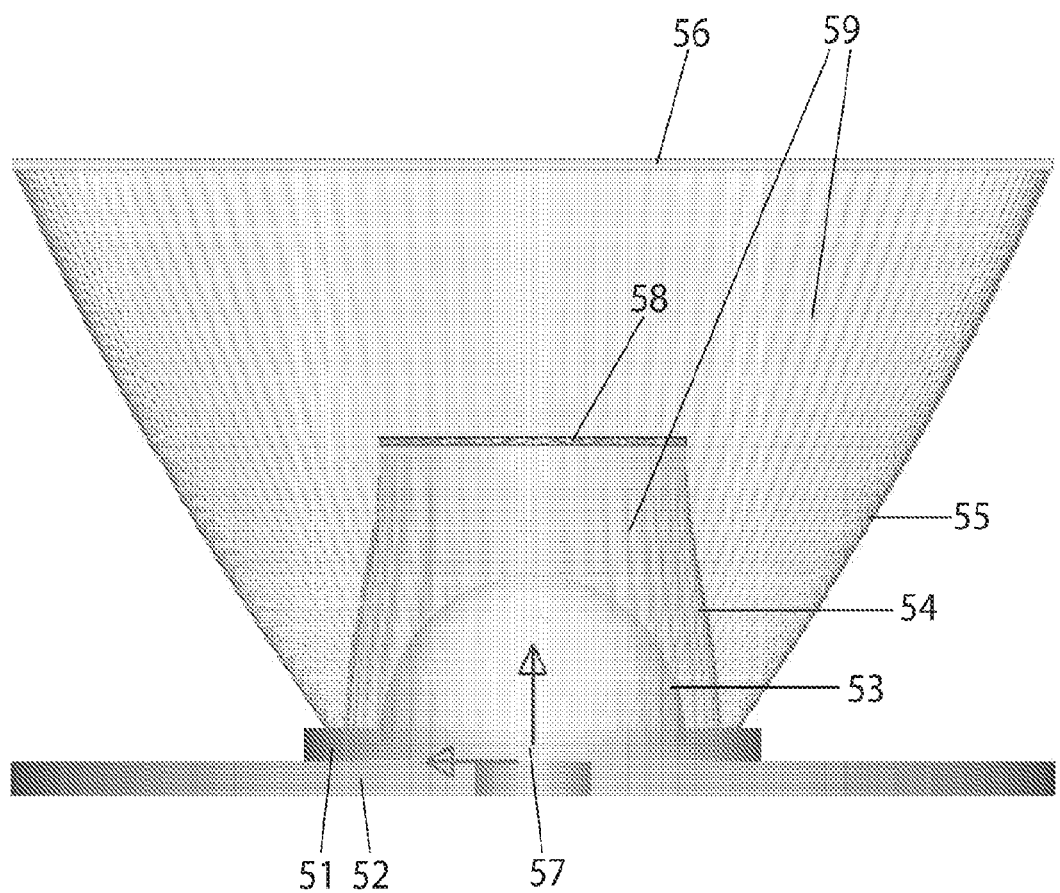

WARM WHITE LIGHTING DEVICE

This application claims the benefit of U.S. Provisional Application No. 60/971,255, filed on Sep. 10, 2007, the entire disclosure of which is incorporated by reference.

Numerous references including various publications are cited and discussed in the description of this invention. The citation and/or discussion of such references is provided merely to clarify the description of the present invention and is not an admission that any such reference is "prior art" to the present invention. All references cited and discussed in this specification are incorporated herein by reference in their entirety and to the same extent as if each reference was individually incorporated by reference.

FIELD OF THE INVENTION

This invention relates to optical devices. More specifically, the present invention relates to multicolor optical light source assemblies that produce a white light pleasing to the human eye.

BACKGROUND OF THE INVENTION

White light for general lighting applications is largely generated by two technologies, incandescence, and fluorescence. Incandescent bulbs are inexpensive, produce high color rendering, and produce 500-1000 lumens. Incandescent bulbs have the further advantage of producing a pleasing warm white light. Warm white is a white characterized by an equivalent black body radiator having a color temperature generally in the range 2700° K.-3500° K. The problem with lighting produced through incandescence is poor energy efficiency, 8-11 lumens/watt, and a short lifetime of approximately 1500 hours.

Fluorescent lamps are classified by the shape and diameter of the lamps. T4 refers to a tubular fluorescent lamp that is four-eighths of an inch in diameter, and T8 is a tubular fluorescent lamp that is eight-eighths of an inch in diameter. T4 and T8 fluorescent lamps dominate general high efficiency lighting and produce 70-85 lumens/watt with a lifetime of approximately 8,000 hours.

SUMMARY OF THE INVENTION

A third technology for general lighting is warm white light produced through solid state light engines. Such light engines are 2 to 5 times as efficient as incandescent bulbs and have an extended lifetime of 35,000-60,000 hours. Solid state warm white light is typically produced by using blue light to excite a red phosphor, or red-orange phosphor. The present invention is directed to improved color mixing and improved collimation of light produced by an array of solid state light engines.

A device in accordance with an embodiment of the present invention preferably includes uniformity and collimation features shown in FIG. 5, which may include:

1) The first micro-lenslet array 58, including radii, conics, aspheric, or Zernike prescriptions to disperse light from the red emitter placed in the center of the light cavity;

2) The lens cavity spline shape of the inner collimation lens 54, including micro-ridges 59 to disperse light before passing on to the TIR reflector 55;

3) The TIR reflector 55, including an optimized spline+ micro-ridges 59 to disperse and redistribute phase as well as provide collimation;

4) The final micro-lenslet layer 56 includes a unique lenslet design placement and randomization factor to homogenize light to produce a uniform warm white light.

The combined effect of the four uniformity and collimation features are preferred for improved light generation. For example, removing the first micro-lenslet array will degrade uniformity performance. Failing to adequately polish the micro-ridges degrades the degree of collimation, leading to widening the beam and reducing the on-axis illuminance or lux ($lm/m^2$). The function of the micro-ridges are described by Ries and Leutz "Squaring the Circle—The use of microstructures for converting and homogenizing beam patterns" Proceedings of SPIE Vol. 5186 Design of Efficient Illumination Systems. The micro-ridge features disclosed do not function alone to produce the desired uniformity. Multiple layers of micro-ridges on the inside surface of the collimation device and on the outside improve uniformity. In addition, the micro-ridges themselves provide no effect on the light having a dispersion angle between ±30° in a collimation device of 10 mm thickness. Adding two layers of micro-lenses improves the homogenization of light within this range.

BRIEF DESCRIPTION OF THE DRAWINGS

The present invention will be more readily understood from the detailed description of exemplary embodiments presented below considered in conjunction with the accompanying drawings, in which:

FIG. 5 is a side view of a light collimation device including features to improve uniformity.

DETAILED DESCRIPTION OF THE INVENTION

One of the fundamental problems with conversion of blue light to red or red-orange light is the quantum deficit or Stokes down conversion loss. Approximately 25% of the radiometric flux is lost when down converting from blue to red. For this reason there is more potential in terms of efficiency in producing white light through the direct emission of multiple primaries than through the conversion of blue light to red light through a wavelength conversion element such as a phosphor.

Light engines including combinations of phosphors and multiple wavelength direct emission primaries can produce white light, but the light must be combined to produce a homogenous, highly uniform white light. White light is also more desirable when it is controlled and directed efficiently.

Unfortunately, conventional multi-colored LEDs, including conventional RGB assemblies, suffer from poor color mixing. Because the LED die emit considerable heat, the LED die are typically widely spaced for heat dissipation. As a consequence, die of different color are spaced apart, and viewers may see different individual colors from different viewing angles. Optical devices for controlled color mixing developed by the applicant are described in commonly-assigned U.S. patent application Ser. No. 11/737,101, the entire content of which is incorporated by reference herein in its entirety.

The present invention is directed to a device which performs the dual function of collimation and color homogenization or mixing. The device is specifically tailored to match the placement of the solid-state emitters making up the light engine or light producing element.

Figure 1:
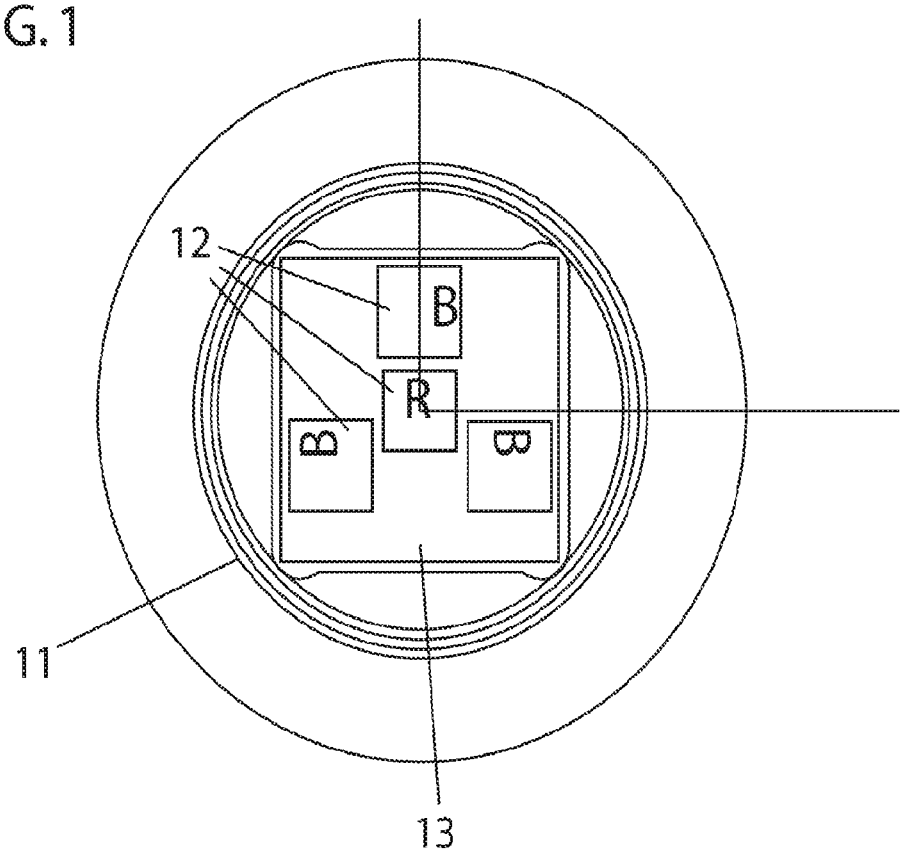
FIG. 1 is a top view of LED placement locations within a light engine cavity.

FIG. 1 shows a top view of emitter placement locations within a light engine cavity. In the drawings, light engine emitter layout B indicates a blue excitation emitter with wavelength 440-495 nm, R indicates a direct emission red, orange, or amber with wavelength range 575-640 nm. The primary reflector ring 11 is composed of aluminum, or other reflective material. The printed wiring board 13 is used to provide electrical connections to the various components including light emitter chips mounted on the printed wiring board.

The Aluminum nitride (AlN) interposer 13 is a heat conductor which improves the transfer of heat from the light emitters to the metal base or heat sink. The thermal path beginning at the die emitter source includes the die emitter attached to an interposer with a thermally conductive adhesive such as a silver-filled epoxy, or eutectic solder. A eutectic solder is a tin/lead solder which when sufficiently heated goes directly from solid to liquid phase without a pasty stage. The interposer is attached to a copper tungsten alloy (CuW) or Al base plate via a eutectic solder or silver filled epoxy interface material. The interposer also serves as a strain buffer layer between the metal base and the sapphire substrate. The coefficient of thermal expansion of aluminum nitride matches well to that of the sapphire substrate upon which the epitaxial layers of the die emitter are deposited.

Figure 2:
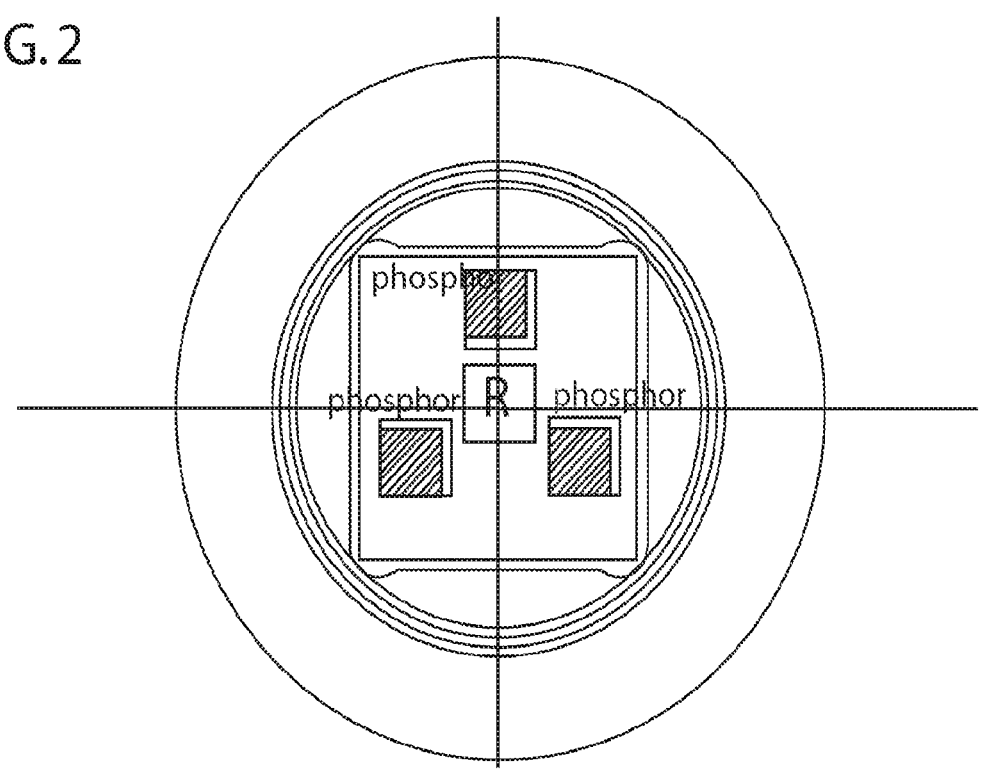
FIG. 2 is a top view of LED placement including phosphor conversion layer.

FIG. 2 shows a top view of the embodiment of FIG. 1, with the addition of a phosphor conversion layer. The phosphors convert blue light to yellow or yellow-orange light and can be integrated through encapsulant dispersion, conformal coating, or by direct application to the emitter.

The encapsulant dispersion process involves mixing a phosphor powder by volume percent with an encapsulant such as high index silicone. The entire LED cavity is filled with the silicone/phosphor composite.

A conformal coating of phosphor/silicone composite is formed through dispersion of phosphor powder into the clear silicone encapsulant bulk material. Settling of the phosphor powder within the bulk material improves the concentration of phosphor residing directly above the die emitter active area. Curing of the phosphor/clear encapsulant composite stops the phosphor settling.

Direct application to the die emitter can be performed by a slurry cure or by electrophoresis, wherein electrophoresis is the movement of a substance through the influence of an electric field.

Optionally, the color temperature may be modified by one or more phosphor layers at least partially covering the LED die. The modification is achieved by fabricating the phosphor layers to cover a portion of the LED die predetermined by either coverage pattern or percent coverage, thereby producing custom white light bins through combinations of direct emission and conversion emission.

Figure 3:
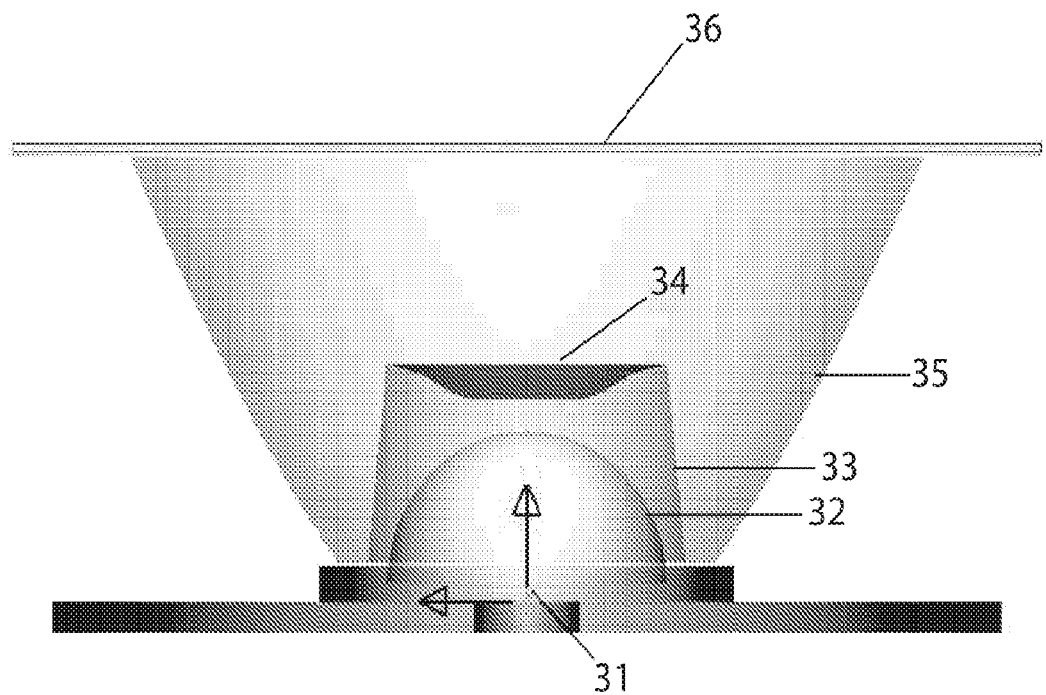
FIG. 3 is a side view of a traditional collimation device.

FIG. 3 is a side view of a light collimation device. As shown in FIG. 3, the light emitter 31 is attached to a printed wiring board. A primary light extraction lens 32 encapsulates the light emitter, and is used to refract the emitted light upward. The light is then directed through an inner collimation lens 33 which further tends to direct the emitted light upward. Refracted light rays having a high angle pass through the top surface 34 of the inner collimation lens. Refracted light rays having a low angle pass through the inner collimation lens and are reflected upward by the TIR reflector 35. Light rays then pass through a final lenslet layer 36 which further improves collimation.

Figure 4:
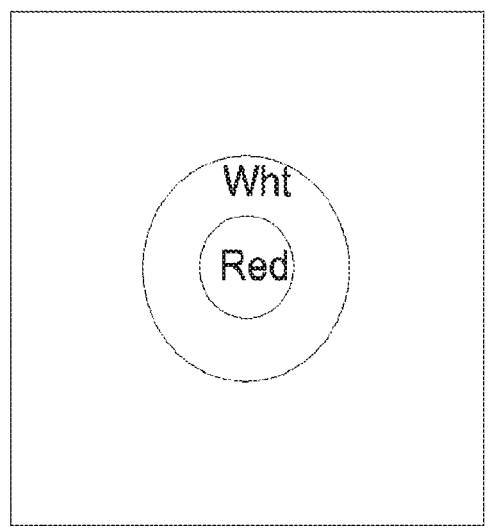
FIG. 4 is an illustration of the illuminance pattern representing poor uniformity as observed on a white screen.

FIG. 4 is an illustration of the illuminance pattern resulting from a light source having poor color uniformity. A relatively large portion of the illuminated area does not have the desired uniformity of white light illumination, but instead has a non-white illumination. Red is depicted in FIG. 4, but it is known in the art that the area of poor color uniformity can be any non-white color, and may be in any portion of the illuminated area, and the non-white region may be of any shape.

FIG. 5 is a side view of a novel light collimation device according to an embodiment of the present invention which includes features to improve uniformity specifically tailored to the emitter placement of FIG. 1 and FIG. 2. A reflector 51 is disposed on the top surface of a printed wiring board 52. The reflector 51 is preferably composed of aluminum. The reflector 51 may be of any shape, and in a preferred embodiment will be substantially circular or ring-shaped. One or more light emitters 57 are mounted to a printed wiring board 52. The light emitters 57 may be mounted to the surface of the printed wiring board 52, or mounted to the reflective surface layer overlying the printed wiring board, or the light emitters 57 may be mounted in a recessed area of the printed wiring board without blockage from the reflector 51. Individual light emitters 57 may be mounted in any of these ways. One or more light emitters 57 may be disposed on, or surrounded by, a single reflector 51.

Above the reflector 51 is a primary light extraction lens 53, the lens directing and focusing light away from the light emitter 57. Surrounding the primary light extraction lens 53 is an inner collimation lens 54, also known as secondary optics. Vertical cross-sections of the sides of the inner collimation lens 54 are in the shape of a lens cavity spline, for instance a Bezier curve or b-spline. A Bezier curve can be described by:

$$P(t) = \sum_{i=0}^{n} \binom{n}{i} (1-t)^{n-i} t^i P_i$$

Figure 15:
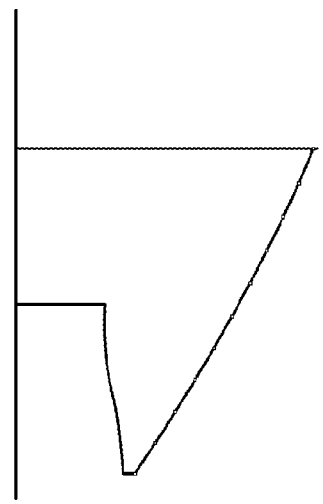
FIG. 15 is an exemplary cross-section of a collimation device having an optimized spline cross-section shape.

The formulation of the Bezier curve equation consists of the ith Bernstein polynomial up to degree n in which the parametric variable t stitches the space between the points $P_i$. The ten points P1-P10 are described by a Radius coordinate $R_i$, and a Z coordinate $Z_i$, and a representative sample curve is shown in FIG. 15. The precise b-spline curve prescription must be exact to properly collimate the light from the die emitter arrangement consisting of three blue pump emitters and a red die in the center of the cavity.

|  | Z (i) | R (i) |
| --- | --- | --- |
| Layer 1 | 0 | 4 |
| Layer 2 | 1 | 4.726675 |
| Layer 3 | 2 | 5.42548 |
| Layer 4 | 3 | 6.096941 |
| Layer 5 | 4 | 6.741233 |
| Layer 6 | 5 | 7.358193 |
| Layer 7 | 6 | 7.947307 |
| Layer 8 | 7 | 8.507677 |
| Layer 9 | 8 | 9.03796 |
| Layer 10 | 9 | 9.536267 |
| Layer 11 | 10 | 10 |

The wall of the inner collimation lens 54 includes micro-ridges to disperse light before the light leaves the inner collimation lens 54 through the side walls. The top surface of the inner collimation lens 54 includes a first micro-lenslet array 58, which may preferably be a simple spherical shape, aspherical, or a more complex shape, depending on the desired radiation pattern of the primary optic. The more complex shape may include one or more shapes such as radii, conics, aspheric, or Zernike prescriptions to disperse light from the red emitter placed in the center of the light cavity.

Surrounding the inner collimation lens 54 is a total internal reflector ("TIR") 55 having a desired contoured shape. The vertical cross-sectional shape of the walls of the TIR reflector 55 includes an optimized spline, which is optimized using for instance a damped least squares, or gradient descent approach, or by using a commercial optimizer such as that contained in the software package entitled "Lighttools" by Optical Research Associates. The inner collimation lens 54 and TIR reflector 55 also incorporate micro-ridges 59 to disperse and redistribute phase as well as provide collimation. The micro-ridges 59 are shown as generally vertical members embedded within the inner collimation lens 54 and TIR reflector 55.

Above the TIR reflector 55 is a final micro-lenslet layer 56 having a desired lenslet design placement and randomization factor to homogenize light, thereby producing a uniform warm white light. The final micro-lenslet array 56, or fly's eye lenslet array operates by using the index of refraction difference between the immersing medium, in this case air, and the index of refraction of the lens to redistribute the color specific phase of the light emanating from the light emitters 57. For instance, referring to the light emitter layout shown in FIG. 1, light emanating from the red, red-orange, or amber colored light emitter placed in the center and the approximately yellow light emanating from the three phosphor coated blue emitters, is homogenized by the final micro-lenslet layer 56.

The micro-fly's eye lenslet arrays 56, 58 operate in a similar fashion to the compound eyes of a fly. The single lens of the human eye focuses light on the fovea of the retina. In contrast, the segmented compound eyes of a fly have a plurality of lenslets which focus light through many rhabdoms to photoreceptors. These structures or ommatidia are distributed over the compound eye. The micro-fly's eye lenslet array 56, 58 analogously makes the light from a single LED light source appear to be emanating from a plurality of light sources. The lenslets introduce micro-caustics, i.e., severe aberration-induced concentrations of light, which serve to disperse the light from the light sources to produce a more homogenous white color. Although the performance of imaging optics is improved by reducing aberrations, the present invention uses non-imaging optics in which homogenization of the emitted light is improved by introducing severe aberrations caused by the micro-lens.

FIGS. 6A-6D show that the power or radius of curvature of the lenslets may be tuned to produce the optimum balance between homogenization and collimation. The lenslets operate in finite conjugate mode, thereby producing intermediate images. The z-axis location of the intermediate image is not uniform across the array of lenslets due to severe field curvature.

Figure 6A:
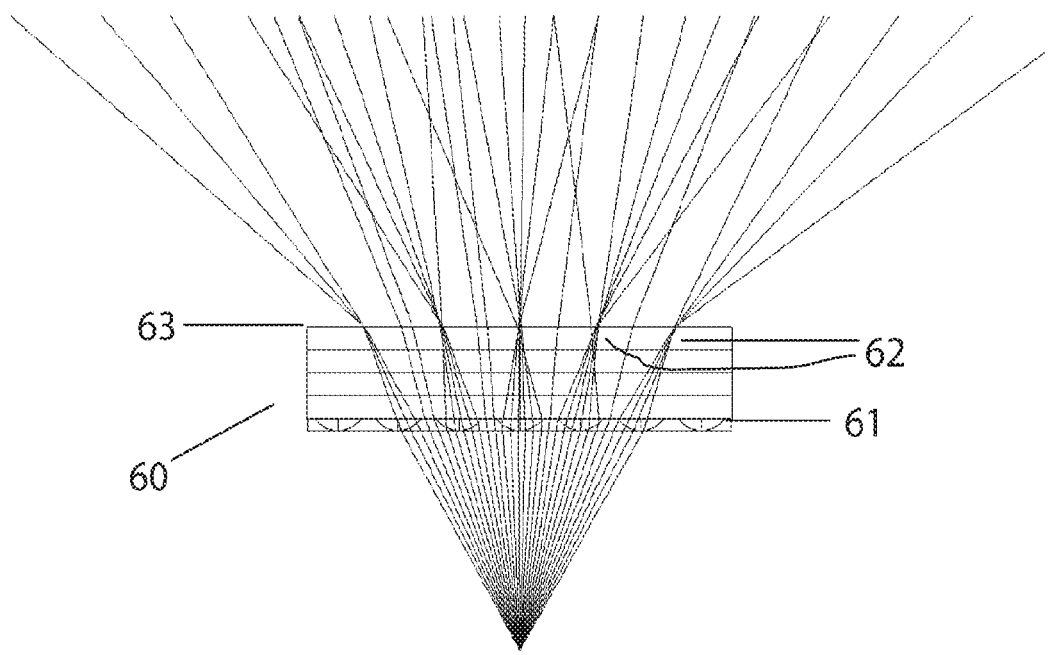
FIGS. 6A-6D show the effect of the micro-lenslet layer and lenslets upon the paths of light rays.
Figure 6B:
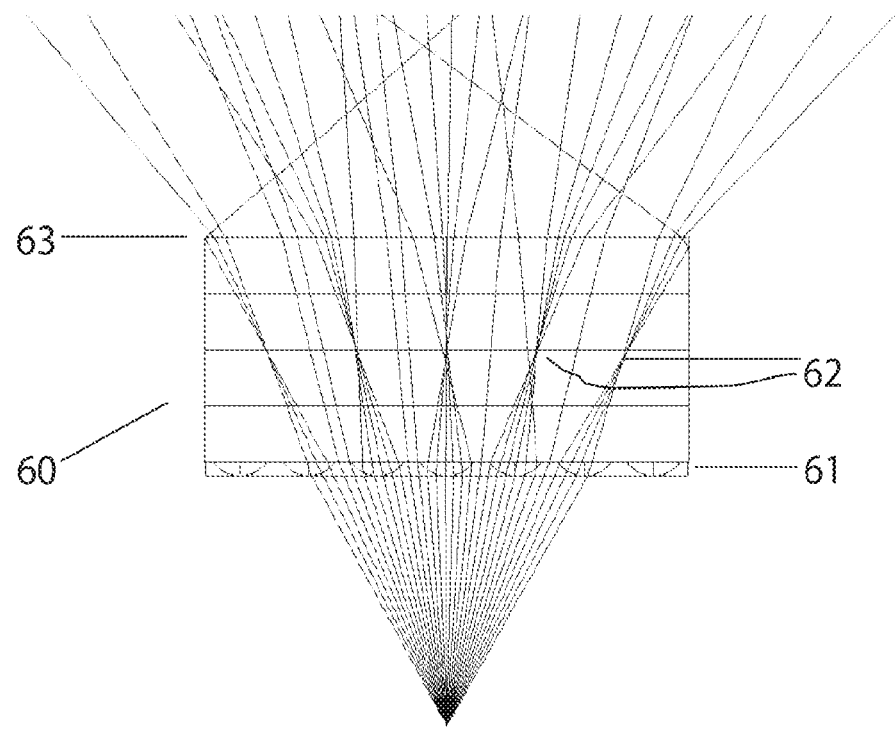
Figure 6C:
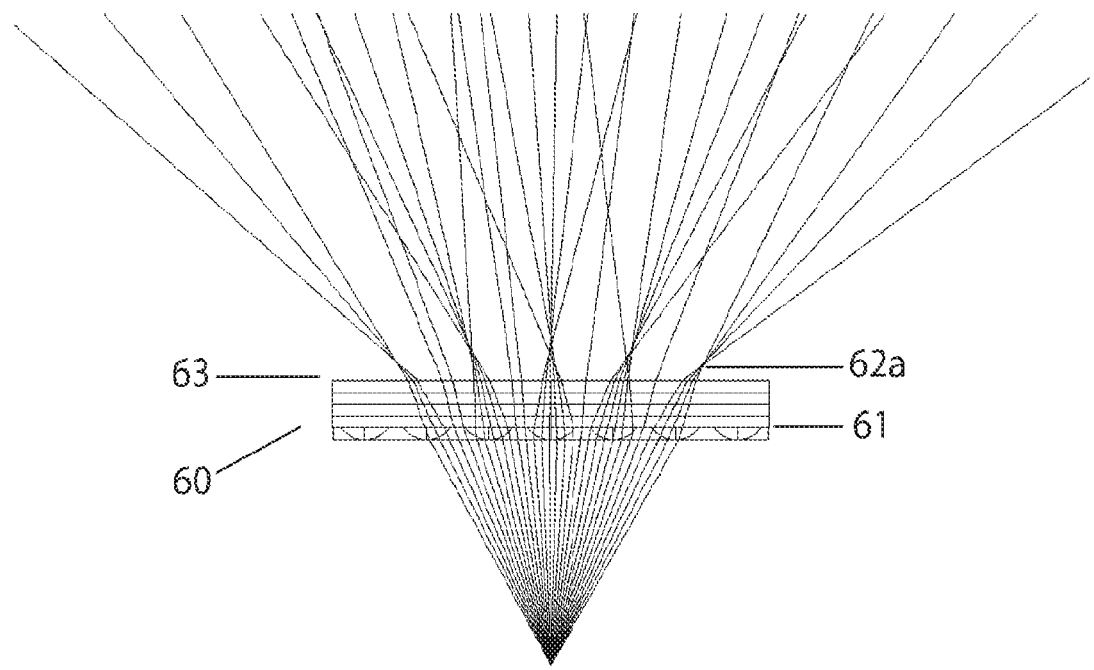

FIGS. 6A-6D also present various embodiments of thickness tuning, defined as controlling the location of the intermediate image with respect to the lenslet array, wherein the z location of the intermediate image may be varied to improve the design prescription of collimation and homogenization. For instance, the intermediate image 62 of FIG. 6A is formed at the upper surface 63 of the lenslet dielectric; the intermediate image 62 of FIG. 6B is formed within the lenslet dielectric; and the intermediate image 62 of FIG. 6C is formed in air outside the lenslet dielectric. Producing the image within the lens dielectric or in the air affects the degree of homogenization/collimation. The objective of thickness tuning is to adjust the collimation and color (or white) uniformity of the emitted light. Typically, a highly collimated source will have less color uniformity than a high color uniformity device due to the off-axis locations of the sources.

Nonimaging optical raytraces allow rays to travel in any direction, to redirect, recirculate, or return to the source. It is preferable to direct as much light in the forward direction as possible. A concentrator which pinches light refers to one which does not redirect rays with 100% efficiency. The source skewness is invariant and entirely dependent on the source distribution of the off-axis sources.

FIG. 6A shows an embodiment of the micro-lenslet layer 60 in which the lenslet prescription 61 produces micro-source images or distributed virtual sources 62 which emanate at the top surface 63 of the micro-lenslet layer 60. The terms intermediate image, micro-source image and distributed virtual sources refer to the reference frame of the optical device acting upon the light. From the reference frame of the source the term intermediate image is used. When referring to the spatial region of the micro-lens the term micro-source image is used. When referring to the spatial region of the micro-lens the term micro-source image is used. The secondary optic acting as a ray distribution operator performs its ray redirection upon an array or distribution of virtual sources.

Figure 6D:
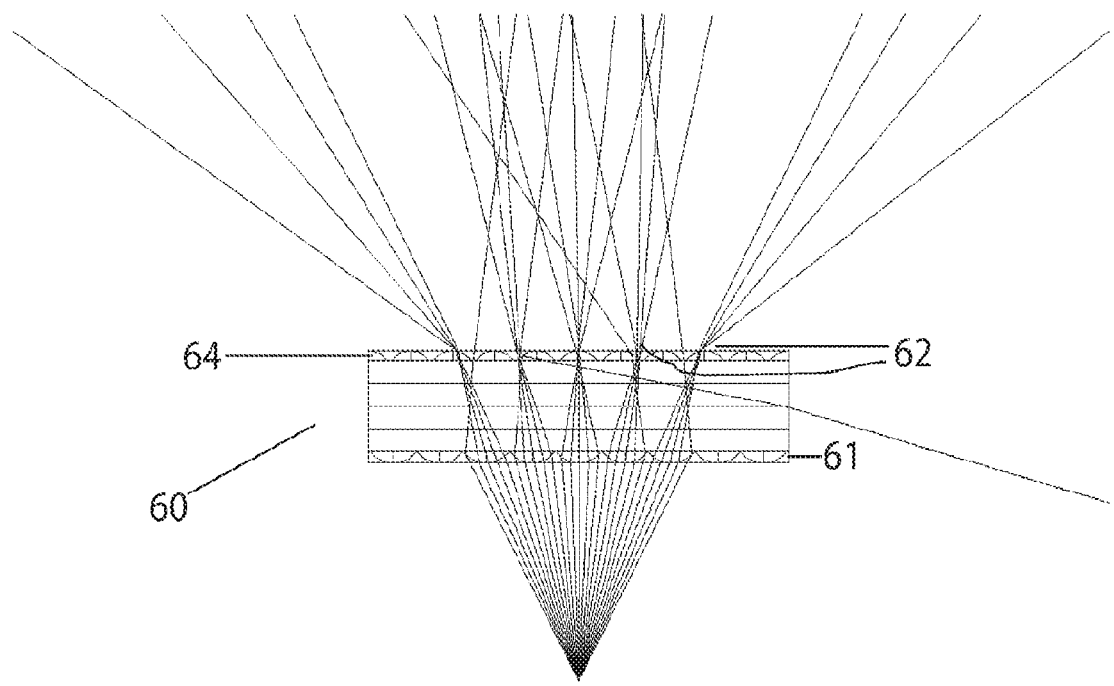

FIG. 6B shows an embodiment of the micro-lenslet layer 60 having a thicker lens and having micro-images 62 of the source contained within the micro-lenslet layer 60. FIG. 6C shows an embodiment of the micro-lenslet layer 60 in which the lenslet prescription 61 causes the light to converge at a plane 62a beyond the exit surface of the micro-lenslet layer 60. FIG. 6D shows an embodiment of the micro-lenslet layer 60 in which a second layer of dispersing lenslets 64 effectively relays the secondary source images to further spread and homogenize the light at the expense of collimation. The various embodiments of the micro-lenslet layer 60 shown in FIGS. 6A-6D may be applied to either the final micro-lenslet layer 56 and the first micro-lenslet layer atop the inner collimation lens 54.

Figure 7A:
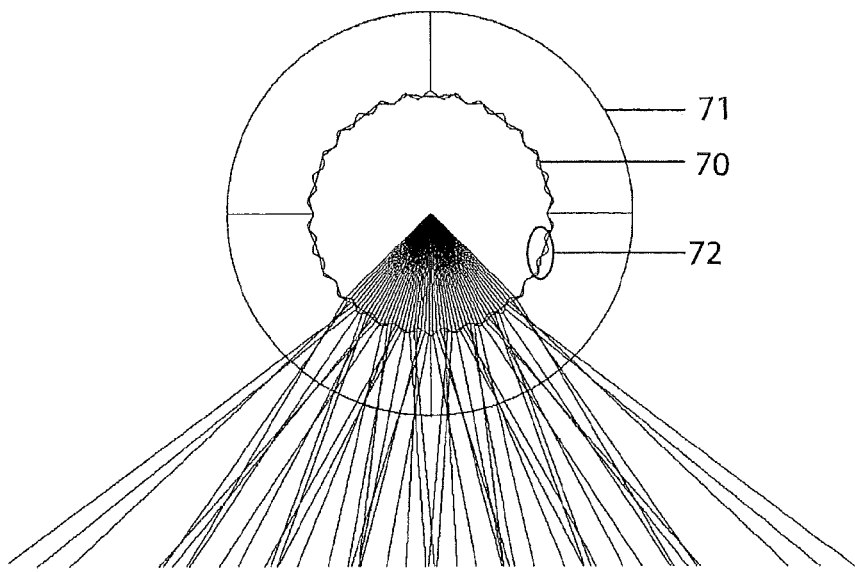
FIGS. 7A-7B show the paths of light rays passing through single-layer and dual-layer micro-ridge lenses.

FIG. 7A shows a horizontal cross-section view of the inner collimation lens 70 and the TIR reflector 71, in which the term lens refers to a refractive operation on the light. In this embodiment, the inner collimation lens 70 includes a single-layer micro-ridge lens 72 which disperses light as it passes in the −Y, ±X direction. The single-layer micro-ridge 72 may form part of the wall of either the inner collimation lens 70 or the TIR reflector 71. A micro-ridge refers to a sharp pyramidal lens shape, whereas a micro-rib is comprised of a B-spline interpolation which is C2 continuous along the edge of the global TIR collimation spline and rounded at the apex of the curve as defined by a weighted control point. A curve possessing C2 continuity is continuous in both the first and second derivatives of the curve.

The single-layer micro-ridge 72 may be used in combination with the micro fly's eye lenslet 56, 58 arrays on a collimation optic to improve uniformity. The micro-ridge lens functions as a micro cylinder lens, focusing light in the X-Y plane rather than the Z direction as in a micro-lens fly's eye array 56, 58.

Figure 7B:
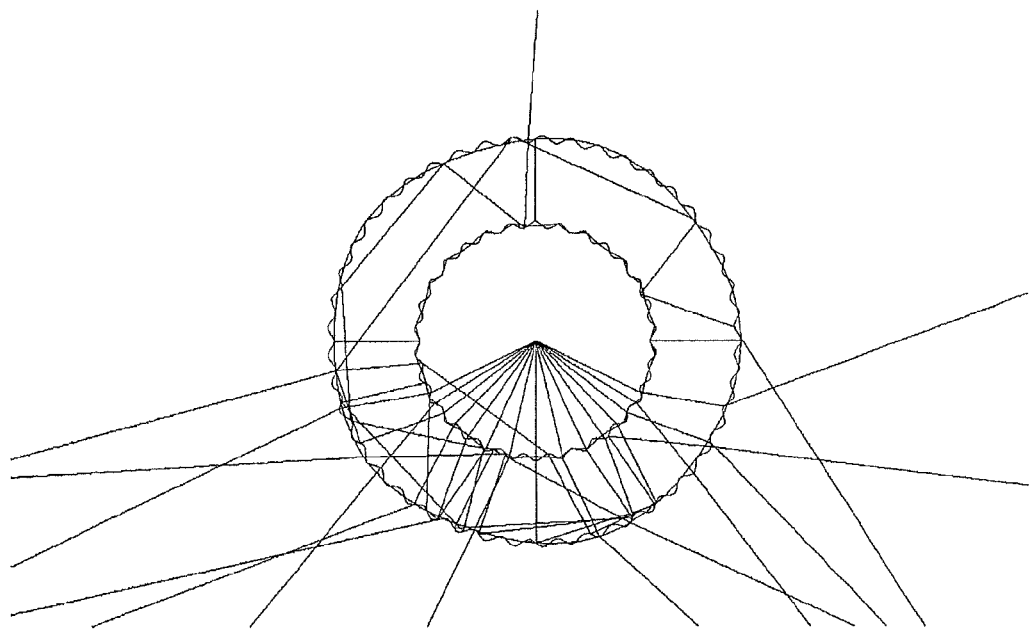

FIG. 7B shows a horizontal cross-section view of the inner collimation lens 70 and the TIR reflector 71 in which both structures include the micro-ridge lens feature. The micro rib lens layer of the inner collimation lens 70 disperses the incident light in many directions through the law of refraction. The micro rib lens layer of the TIR reflector 71 disperses the light through the law of TIR reflection in the X-Y plane. In the Z direction the micro-rib lens collimates the light.

Figure 8:
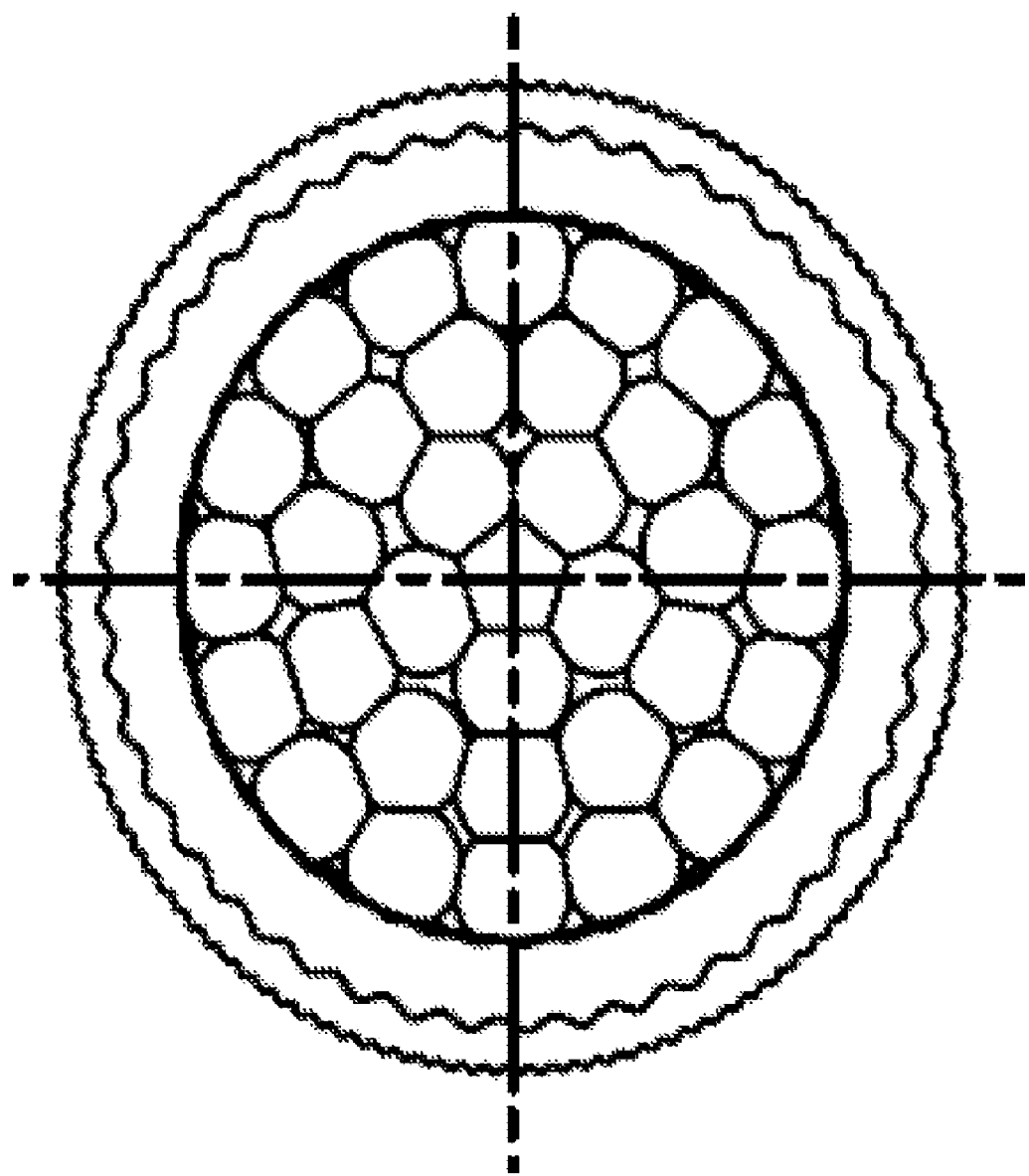
FIG. 8 shows a micro lenslet placement prescription.

FIG. 8 shows an example of a micro lenslet placement prescription, having 61 lenslets in a polar orientation applied to the inner collimation lens 70 which operates on the light from the primary light extraction lens of the LED package first in sequence. This prescription may also be used on the TIR reflector 71.

Figure 9A:
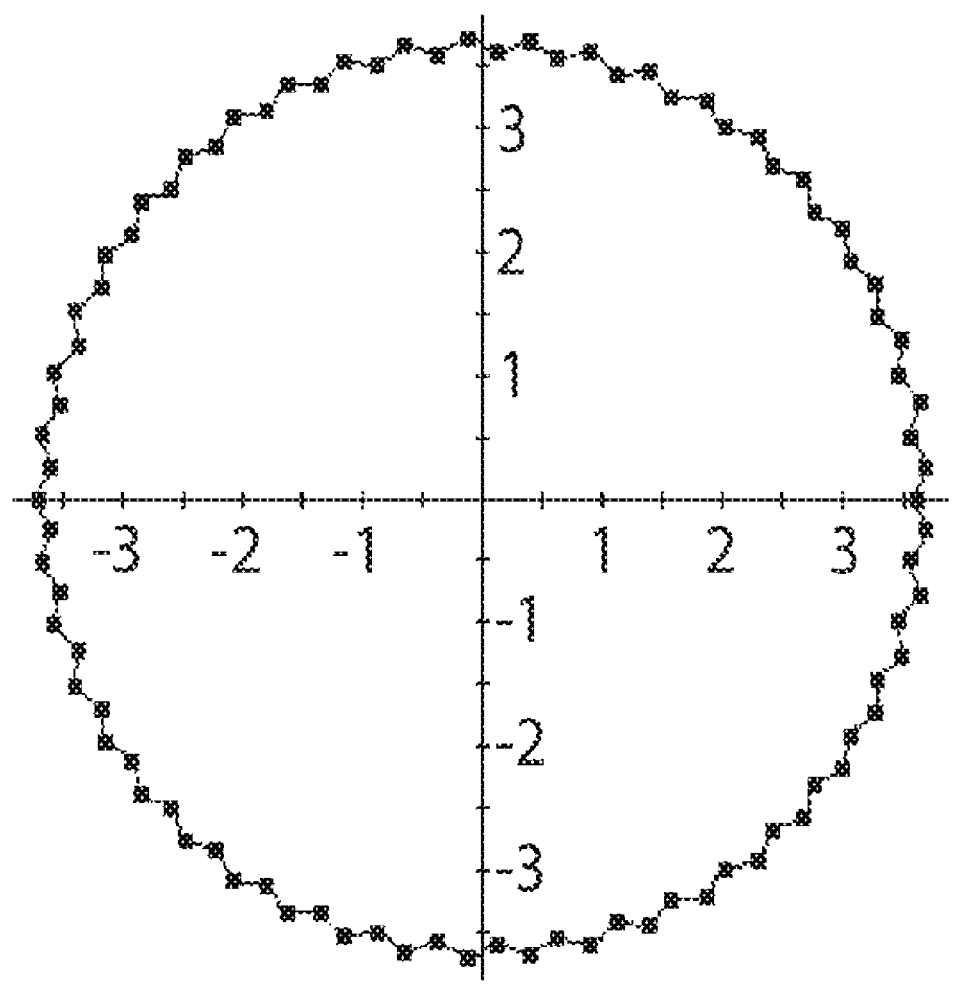
FIG. 9A is a horizontal cross-section view of either the inner collimation lens or the TIR reflector, showing the micro dispersing ribs.

FIG. 9A is a horizontal cross-section view of either the inner collimation lens 70 or the TIR reflector 71, showing the micro-dispersing ribs feature of the present invention. The ridge shape of the cross-section can be described mathematically by the equation:

$$f_1(x) = (RADIUS) * SIN((360/(x)*(FIRSTPARAM)))*\pi/180)$$

$$f_1(y) = (RADIUS) * COS((360/(y)*(FIRSTPARAM)))*\pi/180)$$

$$f_2(x) = (RADIUS) + (PEAK)) * SIN((((360/x)*(FIRSTPARAM)) + (360/x)/2)*(\pi/180))$$

$$f_2(y) = ((RADIUS) + (PEAK)) * COS((((360/y)*(FIRSTPARAM)) + (360/y)/2)*(\pi/180))$$

Rib angle: $\tan^{-1}((f_2(y)-f_1(y))/(f_2(x)-f_1(x)))*(180/\pi)$ firstparam: reference starting point=1.

Figure 9B:
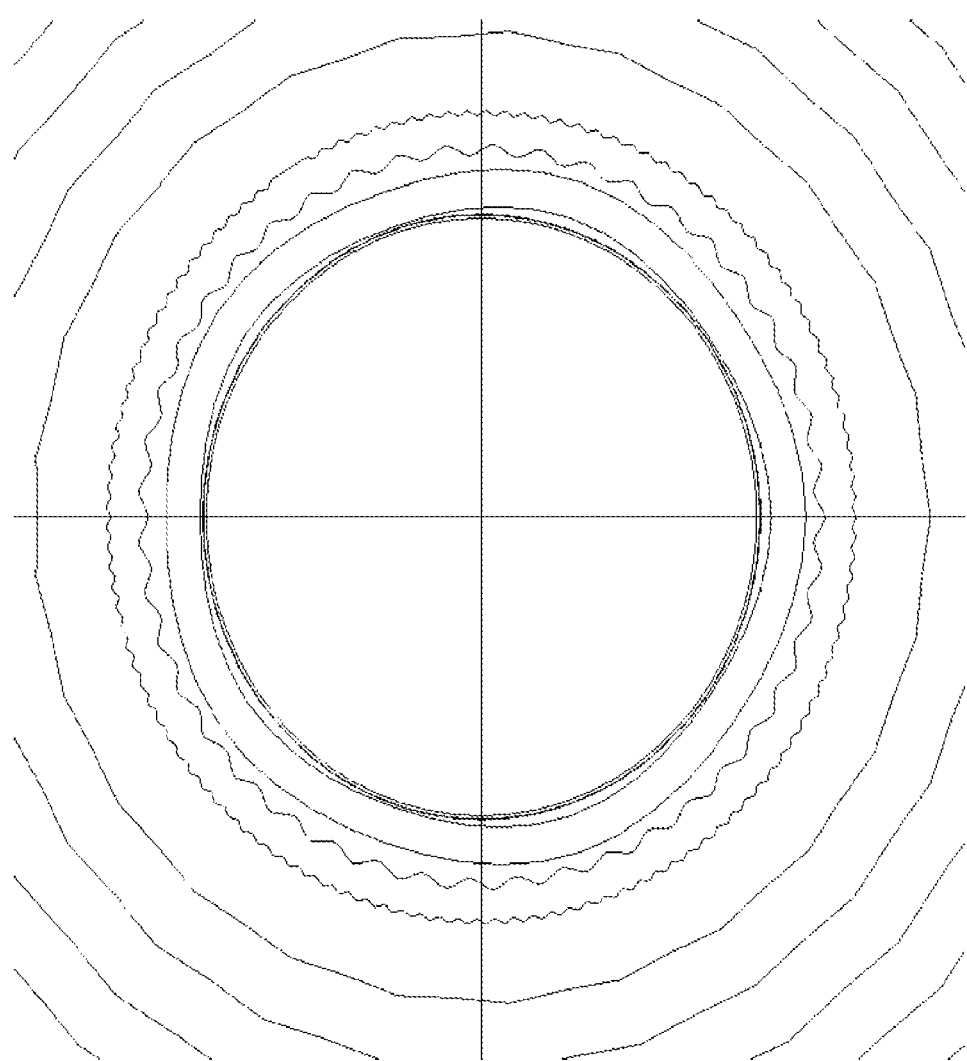
FIG. 9B is a projected top view of the inner refractive and outer TIR reflective micro-rib lenses.

Where:
Radius=inner radius of profile
Num=number of peaks within 360°
Peak=peak amplitude of ridge wave FIG. 9B is a projected top view of the cross section of the inner refractive and outer TIR reflective micro-rib lenses 59, in which the inner lenslet array has been removed to clarify the view of the base of the optic. It is the view seen by the final micro-lens array 56, showing the change in the cross-section shape of the TIR reflector at each profile.

Figure 10:
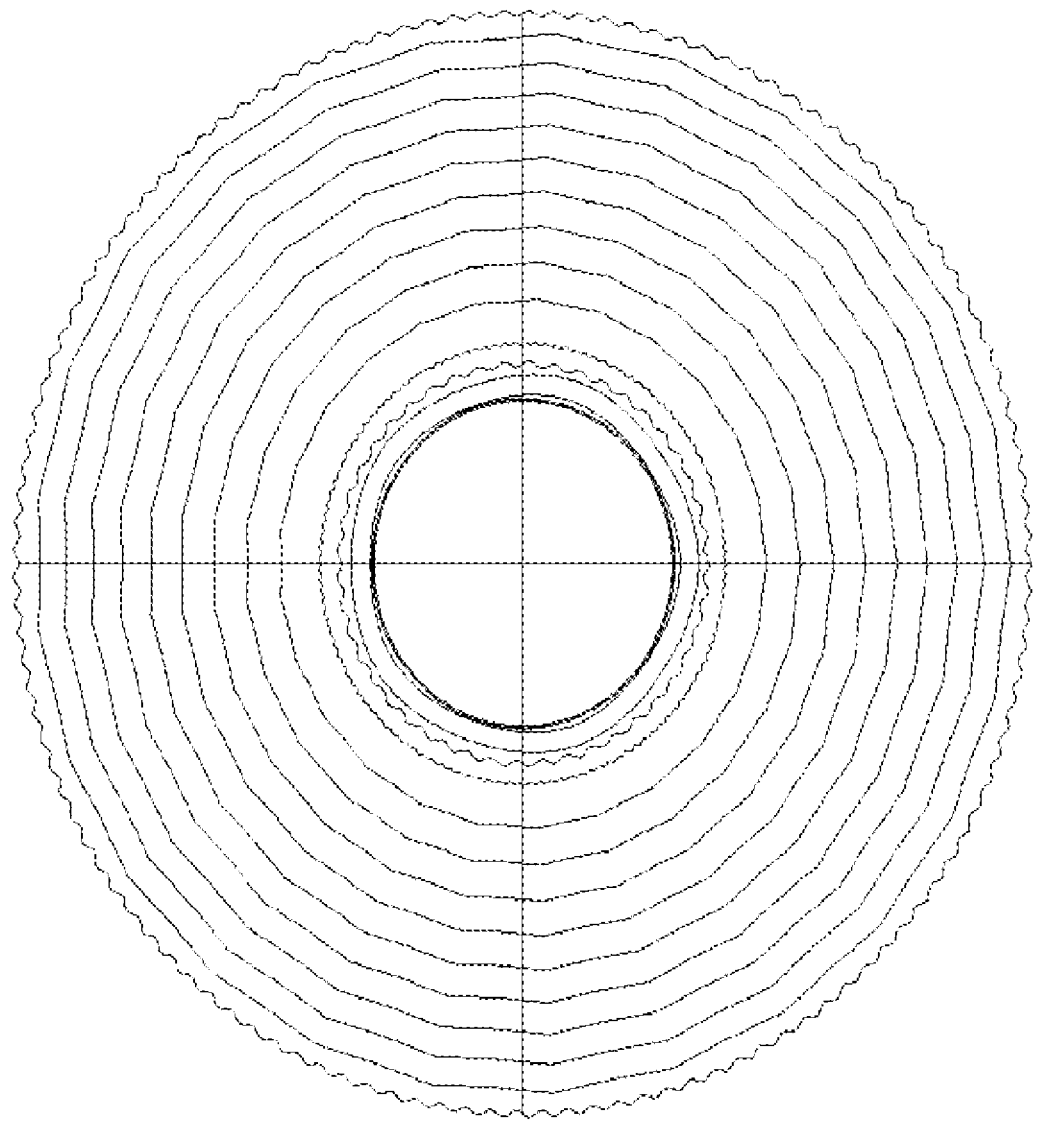
FIG. 10 is a cumulative projection of several outer horizontal cross-section view of the TIR reflector at the final vertical profile.

FIG. 10 is a cumulative projection of several outer horizontal cross-sectional view of the TIR reflector 71 at TIR ridge level 2, where ridge level 1 refers to the base of the TIR optic, and ridge level 2 refers to the final vertical profile.

Figure 11:
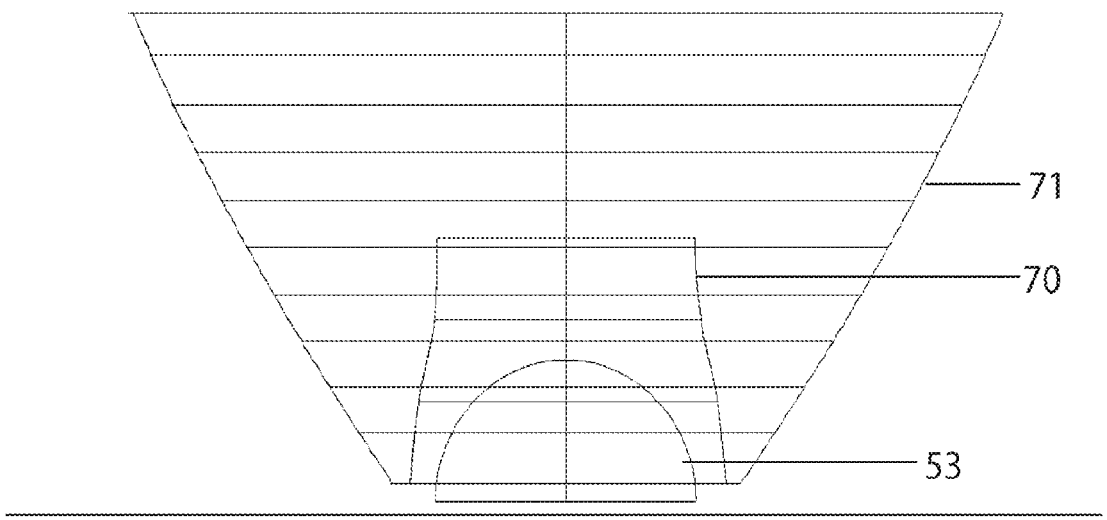
FIG. 11 is a projection view of the collimation spline.

FIG. 11 is a side, vertical cross-section view of one embodiment of the invention, showing the TIR collimation spline shape of the TIR reflector 71, the inner light control spline shape of the inner reflector 70, and the primary light extraction lens 53. Each layer of the TIR reflector 71 in the Z direction has an inner and outer radius given by the following table. The outer radius (Radius 2) is defined as the radius of a circular horizontal envelope encompassing the outer ridges of the micro-rib structure. The mathematical equations describing the shape have been presented above. The inner radius (Radius 1) is defined as the radius of a circular horizontal envelope tangent to the inner ridges of the micro-rib structure. At layer junctions, the prescriptions are merged in order to provide for a smooth transition from one layer to the next layer.

|  | Z | Radius 1 | Radius 2 |
|---|---|---|---|
| Layer 1 | 0 | 4 | 4.045197 |
| Layer 2 | 1 | 4.726675 | 4.780082 |
| Layer 3 | 2 | 5.42548 | 5.486784 |
| Layer 4 | 3 | 6.096941 | 6.165832 |
| Layer 5 | 4 | 6.741233 | 6.817404 |
| Layer 6 | 5 | 7.358193 | 7.441335 |
| Layer 7 | 6 | 7.947307 | 8.037105 |
| Layer 8 | 7 | 8.507677 | 8.603807 |
| Layer 9 | 8 | 9.03796 | 9.140082 |
| Layer 10 | 9 | 9.536267 | 9.644019 |
| Layer 11 | 10 | 10 | 10.11299 |

Figure 12:
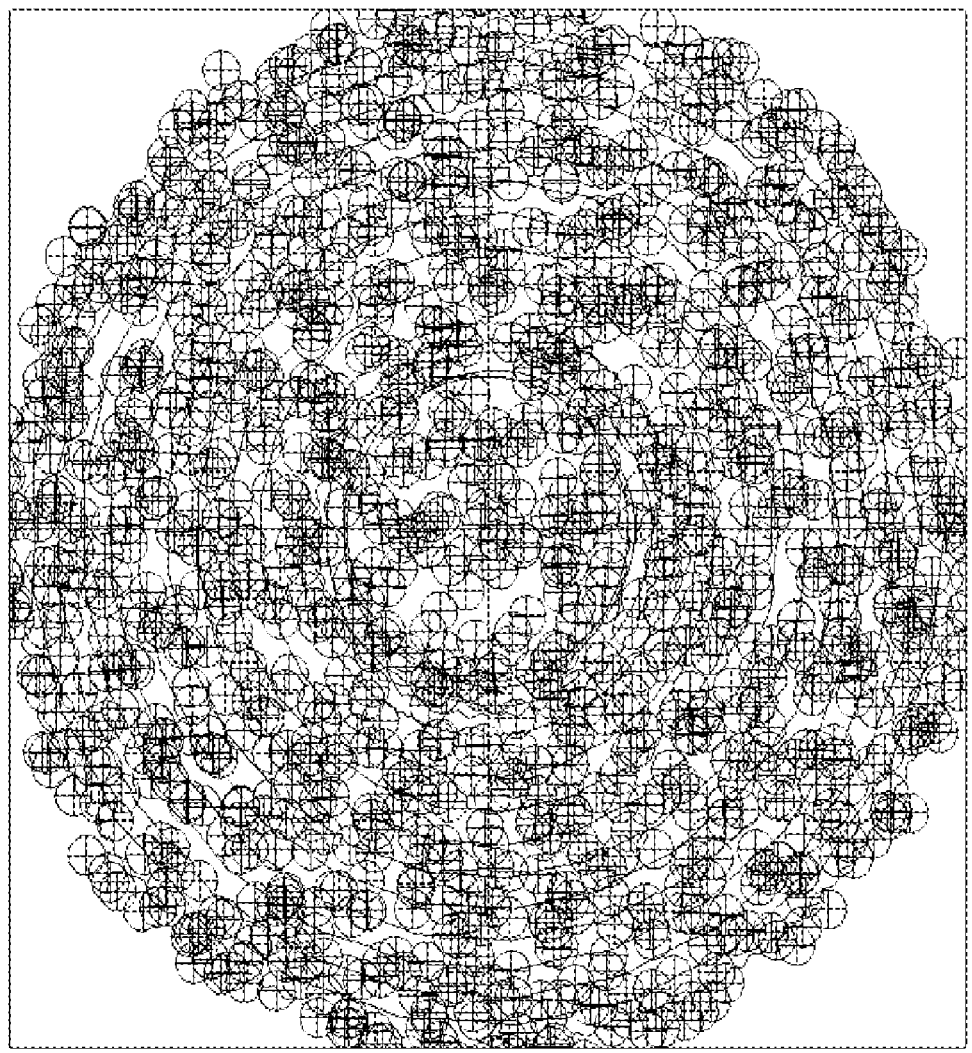
FIG. 12 is a top view of the uniformity enhancement lenslet array.

FIG. 12 is a top view of an example of the lenslet array layer 56 at the top of the TIR reflector 71, showing the locations of the dispersing micro-lenslets. The illustrated embodiment is shown with 1501 lenslets.

Figure 13:
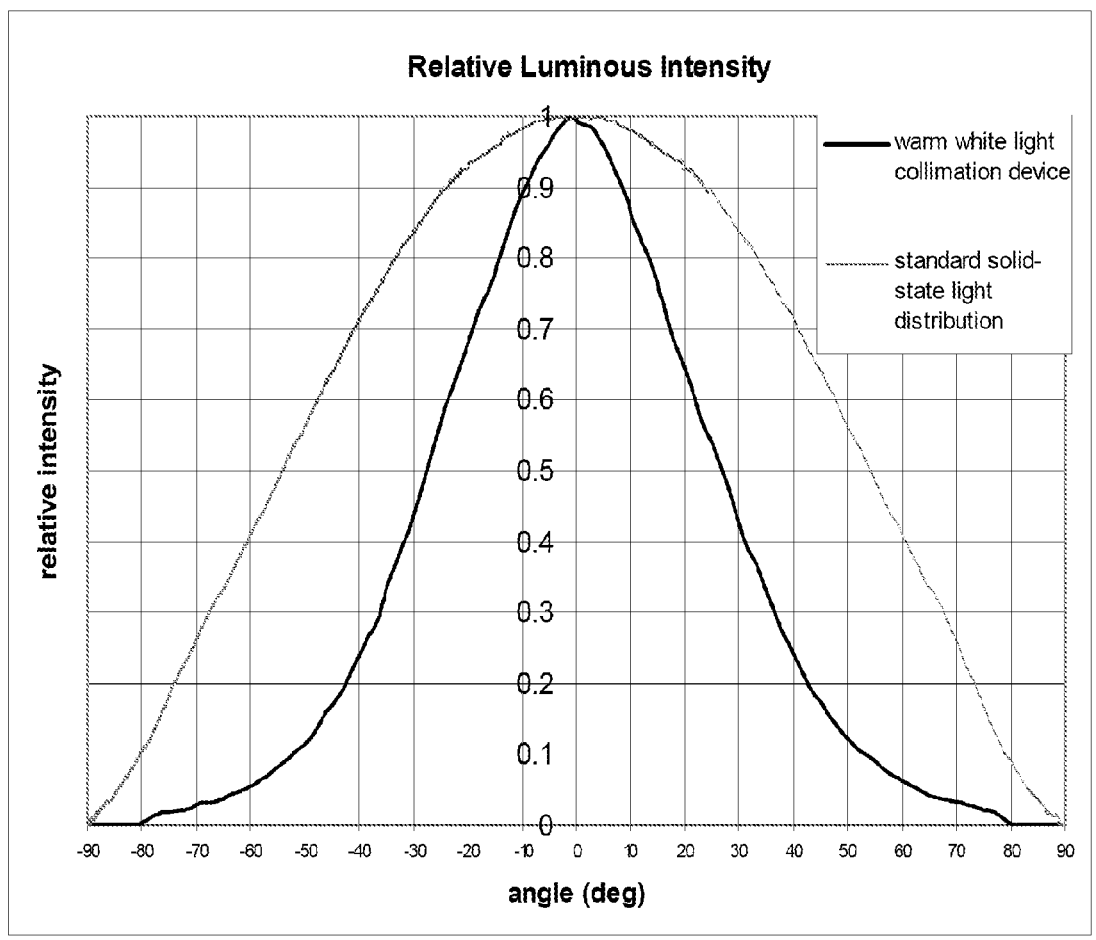
FIG. 13 is a calculated graph of relative luminous intensity distribution for both a standard device and a collimation device.

FIG. 13 shows the relative luminous intensity distribution for both a standard solid-state white light source and a collimation and uniformity enhancement device of the present invention. The beam dispersion angle is reduced from 110 degrees for the standard device, to 52 degrees for a device of the present invention, where the beam dispersion angle is measured as the side-to-side angle where the relative luminous intensity of the light beam has fallen off to 50% of the on-axis intensity of the light beam.

Figure 14:
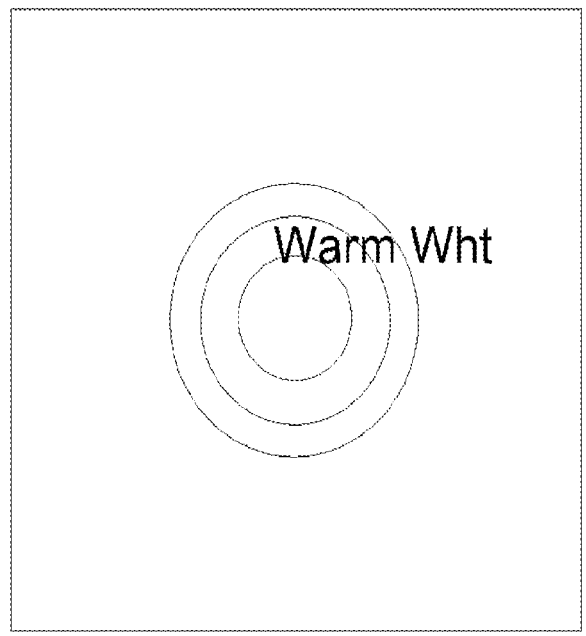
FIG. 14 is a calculation of the illuminance pattern produced by a warm white collimation device.

FIG. 14 is an illustration of the illuminance pattern resulting from a light source having significantly higher color uniformity than a traditional lens. A relatively large portion of the illuminated area is illuminated with white light, specifically warm white light.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

This application may disclose several numerical range limitations. Persons skilled in the art would recognize that the numerical ranges disclosed inherently support any range within the disclosed numerical ranges even though a precise range limitation is not stated verbatim in the specification because this invention can be practiced throughout the disclosed numerical ranges. The entire disclosure of the patents and publications referred in this application are hereby incorporated herein by reference.

The invention claimed is:

1. An apparatus for producing improved warm white light, comprising:

a light collimation lens configured to receive light from a light engine and to produce collimated light;
a first micro-lenslet array disposed to receive at least a portion of the collimated light to produce dispersed light; a ribbed reflector disposed to reflect at least a portion of the dispersed light and the collimated light to produce reflected light; and
a second micro-lenslet array disposed to receive at least a portion of the reflected light to produce warm white light having improved collimation and mixing characteristics.

2. The apparatus of claim 1, wherein at least one of the first micro-lenslet array and the second micro-lenslet array comprises at least one lenslet having a surface shape selected from the group consisting of radii, conic, aspheric, and Zernike.

3. The apparatus of claim 1, wherein at least one of the first micro-lenslet array and the second micro-lenslet array is configured to include a predetermined placement of lenslets within at least one of the first micro-lenslet array and the second micro-lenslet array that improves the homogenization of the warm white light.

4. The apparatus of claim 1, wherein at least one of the first micro-lenslet array and the second micro-lenslet assay is configured to include a predetermined factor randomizing a surface shape of lenslets within at least one of the first micro-lenslet arsay and the second micro-lenslet array that improves the homogenization of the warn white light.

5. The apparatus of claim 1, wherein at least one of the first micro-lenslet array and the second micro-lenslet array is configured to produce an intermediate image at an upper surface of the respective lenslet dielectric.

6. The apparatus of claim 1, wherein at least one of the first micro-lenslet array and the second micro-lenslet array is configured to produce an intermediate image within a respective lenslet dielectric.

7. The apparatus of claim 1, wherein at least one of the first micro-lenslet array and the second micro-lenslet array is configured to produce an intermediate image outside a respective lenslet dielectric.

8. The apparatus of claim 1, wherein the light collimation lens comprises an approximately barrel-shaped sidewall.

9. The apparatus of claim 8, wherein the sidewall is configured to have a spline-shaped vertical cross-section.

10. The apparatus of claim 8, wherein the sidewall comprises at least a first plurality of micro-ridges.

11. The apparatus of claim 10, wherein the first plurality of micro-ridges covers a portion less than a whole of the sidewall, and the sidewall further comprises at least a second plurality of micro-ridges, wherein the first plurality of micro-ridges and the at least second plurality of micro-ridges are non-overlapping.

12. The apparatus of claim 1, further comprising a light extraction lens directing light to the light collimation lens.

13. The apparatus of claim 1, wherein the ribbed reflector is configured to have a spline-shaped vertical cross-section.

14. The apparatus of claim 13, wherein the ribbed reflector comprises at least a first plurality of micro-ridges.

15. The apparatus of claim 14, wherein the first plurality of micro-ridges covers a portion less than a whole of the ribbed reflector, and the ribbed reflector further comprises at least a second plurality of micro-ridges, wherein the first plurality of micro-ridges and the at least second plurality of micro-ridges are non-overlapping.

16. A system for producing improved warm white light, comprising:
a light engine;
a light collimation lens configured to receive light from the light engine and to produce collimated light;
a first micro-lenslet array disposed to receive at least a portion of the collimated light to produce dispersed light:
a ribbed reflector disposed to reflect at least a portion of the dispersed light and the collimated light to produce reflected light;
and a second micro-lenslet array disposed to receive at least a portion of the reflected light to produce warn white light having improved collimation and mixing characteristics.

17. The system of claim 16, wherein the light engine comprises: a printed circuit board;
an interposer disposed on the printed circuit board;
a plurality of non-white solid state light emitters disposed on the interposer, the interposer configured to provide thermal conduction and strain relief for the light emitters; and
a reflector reflecting at least a portion of the light from the light emitters.

18. The system of claim 17, wherein the light engine further comprises a phosphor at least partially disposed over at least a portion of the plurality of non-white solid state light emitters.

19. The system of claim 18, wherein the phosphor is dispersed within an encapsulant overlying at least a portion of the plurality of non-white solid state light emitters.

20. The system of claim 18, wherein the phosphor is formed within a conformal coating overlying at least a portion of the plurality of non-white solid state light emitters.

21. The system of claim 18, wherein the phosphor is directly applied to at least a portion of the plurality of non-white solid state light emitters.

22. The system of claim 19, wherein the phosphor is mixed with a high index silicone encapsulant.

23. The system of claim 20, wherein the phosphor comprises a powder settled within a clear silicone encapsulant bulk material.

24. A method for producing improved wasm white light, comprising the following steps:
emitting light using a plurality of non-white solid state light emitters;
collimating at least a portion of the emitted light using a light collimation lens to produce collimated light;
dispersing at least a portion of the collimated light using a first micro-lenslet array to produce dispersed light;
reflecting at least a portion of the dispersed light and the collimated light using a ribbed reflector to produce reflected light; and
receiving at least a portion of the reflected light using a second micro-lenslet array to produce warm white light having improved collimation and mixing characteristics.

25. The method of claim 24, further comprising the step of converting the wavelength of at least a portion of the emitted light using a phosphor.

26. The method of claim 25, further comprising the step of disposing the phosphor at least partially over at least a portion of the plurality of non-white solid state light emitters.

27. The method of claim 26, wherein the step of disposing the phosphor further comprises the following steps:
mixing a phosphor powder by volume percent with a silicone-based material; and
encapsulating the plurality of non-white solid state light emitters with the mixed silicone-based material.

28. The method of claim 26, wherein the step of disposing the phosphor further comprises the following steps:
- dispersing a phosphor powder into a silicone-based material;
- encapsulating the plurality of non-white solid state light emitters with the mixed silicone-based material;
- settling the phosphor powder within the silicone-based material; and curing the silicone-based material.

29. The method of claim 26, wherein the step of disposing the phosphor further comprises the following steps:
- applying a slurry containing the phosphor to the plurality of non-white solid state light emitters; and
- curing the slurry.

30. The method of claim 26, wherein the step of disposing the phosphor further comprises the following steps:
- applying a slurry containing the phosphor to the plurality of non-white solid state light emitters; and
- applying an electric field to deposit the phosphor by electrophoresis.

31. The method of claim 25, wherein the phosphor is formed within a conformal coating overlying at least a portion of the plurality of non-white solid state light emitters.

32. The apparatus of claim 1, wherein the ribbed reflector comprises a sidewall having a plurality of micro-ridges vertically disposed thereon, wherein a cross-section of each micro-ridge comprises a pyramidal lens shape.

33. The apparatus of claim 1, wherein the light collimation lens comprises a sidewall having a plurality of micro-ridges vertically disposed thereon, wherein a cross-section of each micro-ridge comprises a pyramidal lens shape.

* * * * *